United States Patent
Sato et al.

(10) Patent No.: US 7,455,103 B2
(45) Date of Patent: Nov. 25, 2008

(54) ELECTRONIC EQUIPMENT PROVIDED WITH COOLING SYSTEM

(75) Inventors: Katsuya Sato, Zama (JP); Hironori Oikawa, Hadano (JP)

(73) Assignee: Hitachi, Ltd., Tokyo (JP)

( * ) Notice: Subject to any disclaimer, the term of this patent is extended or adjusted under 35 U.S.C. 154(b) by 289 days.

(21) Appl. No.: 10/796,049

(22) Filed: Mar. 10, 2004

(65) Prior Publication Data

US 2005/0034466 A1    Feb. 17, 2005

(30) Foreign Application Priority Data

Aug. 11, 2003    (JP) ............................. 2003-291511

(51) Int. Cl.
F25D 9/00  (2006.01)
F28D 20/02  (2006.01)

(52) U.S. Cl. ....................... 165/299; 165/300; 165/80.4; 165/80.5; 165/104.31; 165/104.33; 361/697; 361/698; 361/699; 361/701; 361/702; 361/703

(58) Field of Classification Search ................. 165/299, 165/300, 80.4, 80.5, 104.31, 104.33; 236/49.3; 361/697, 701, 702, 703, 698, 699
See application file for complete search history.

(56) References Cited

U.S. PATENT DOCUMENTS 5,197,858 A * 3/1993 Cheng ........................... 417/14
6,352,055 B1 * 3/2002 Algrain et al. ............ 123/41.44
6,414,843 B1 * 7/2002 Takeda ........................ 361/687

FOREIGN PATENT DOCUMENTS

| JP | 412629 | 11/2000 |
|---|---|---|
| JP | 420326 | 1/2001 |
| JP | 2002-353668 | 12/2002 |
| JP | 2003314936 A * | 11/2003 |
| TW | 412629 | 11/2000 |

OTHER PUBLICATIONS

Li and Lam, "Principles of Fluid Mechanics", Addison and Wesley, 1964, p. 366.*
Translated Abstract of Taiwan 412629 (Nov. 20, 2000).

* cited by examiner

Primary Examiner—John K Ford
(74) Attorney, Agent, or Firm—Mattingly, Stanger, Malur & Brundidge, P.C.

(57) ABSTRACT

An electronic equipment is provided, which comprises a liquid-cooling system and a cooling fan as a cooling system, efficiently cools the liquid-cooling system, and reduces fan noise. The electronic equipment is provided with a liquid-cooling system, in which heat generated in a heat generating portion is transmitted to a heat radiating portion with a liquid as a medium to achieve cooling, and an air-cooling system, in which heat transmitted to the heat radiating portion is forcedly cooled, and comprises a pump that circulates the liquid between the heat generating portion and the heat radiating portion, a fan that forcedly discharges heat of the heat radiating portion to an outside, a temperature sensor that detects temperature of the heat generating portion, and storage information that beforehand prescribes the relationship between temperature of the heat generating portion and voltages of the pump and the fan, the electronic equipment being constructed such that a pump voltage is raised without changing a fan voltage when the detected temperature exceeds a first temperature, and a fan voltage is raised when temperature detected by the temperature sensor exceeds a second temperature higher than the first temperature, thus further increasing a cooling capacity.

3 Claims, 6 Drawing Sheets

| | Case | Tcase | FAN VOLTAGE | PUMP VOLTAGE | NOISE LEVEL |
|---|---|---|---|---|---|
| (a) | 1 | 55 | 8V | 8V | 24.2dB |
| (b) | 2 | 55 | 7V | 9V | 22.5dB |

| | Case | Tcase | FAN VOLTAGE | PUMP VOLTAGE | NOISE LEVEL |
|---|---|---|---|---|---|
| (a) | 1 | 55 | 8V | 8V | 24.2dB |
| (b) | 2 | 55 | 7V | 9V | 22.5dB |

FIG. 5

| CALORIFIC POWER (W) | LIQUID TEMPERATURE Tq(°C) | HEAT RESISTANCE ΔT(°C) | TEMPERATURE OF HEAT GENERATING PORTION Tcase (°C) |
|---|---|---|---|
| 40 | 51 | 4 | 55 |
| 45 | 52 | 3 | 55 |
| 50 | 53 | 3 | 56 |
| 55 | 54 | 3.5 | 57.5 |

ELECTRONIC EQUIPMENT PROVIDED WITH COOLING SYSTEM

CROSS-REFERENCE TO RELATED APPLICATION

The present application claims priority from JP-A-2003-291511, the entirety of which is hereby incorporated by reference.

BACKGROUND OF THE INVENTION

1. Field of the Invention

The present invention relates to a cooling system for an electronic equipment, the cooling system comprising a liquid-cooling system that cools a heat generating portion with a liquid as a medium, and a forced air-cooling system that uses a fan to discharge heat transported from the heat generating portion to an outside.

2. Description of the Related Art

It is a well-known fact that semiconductors used in an electronic equipment, especially, semiconductors typified by CPU in an information processing equipment have developed amazingly, and have steadily followed a tendency toward an increase in calorific power and density. Correspondingly, a cooling system has also developed steadily as in a natural air-cooling system, in which heat is transmitted to a heat sink, etc. and radiated to an air by way of heat transmission, a forced air-cooling system that uses a fan, a liquid-cooling system, in which a heat absorbing jacket mounted on a heat generating portion transmits heat to a heat radiating portion with a circulating liquid as a medium to radiate heat, and the like.

In recent years, the liquid-cooling system is adopted as a cooling system for desktop type personal computers and high-density servers that have a margin in a housing space and mount thereon a CPU of high calorific power, and a hybrid system enhanced in cooling capacity by the use of a fan to forcedly radiate heat transmitted to a heat radiating portion has been proposed (for example, see Patent Document 1).

Patent Document 1: JP-A-2002-353668

SUMMARY OF THE INVENTION

By the way, it has been thought that the liquid-cooling system has a great advantage in realization of reduced noise by an arrangement free from use of any fan in addition to its large heat transmitting capacity. Since the hybrid cooling system uses a fan, noise in the system is increased. Also, in the case where a fan and a pump for driving of a liquid are not balanced well in capacity, the fan is in some cases unnecessarily operated even when cooling can be achieved by increasing a fluid flow rate with the use of a pump, and such operation of the fan incurs an increase in noise and shortening of life of the fan in some cases.

It is an object of the invention to provide a control method for a fan and a pump in an electronic equipment provided with a liquid-cooling system and a fan air-cooling system as a cooling system, the method efficiently using the liquid-cooling system, suppressing an increase in noise produced by a fan, and achieving lengthening of the fan and a pump in life.

In order to solve the problem, the invention mainly adopts the following construction.

An electronic equipment provided with a liquid-cooling system, in which heat generated in a heat generating portion is transmitted to a heat radiating portion with a liquid as a medium to achieve cooling, and an air-cooling system, in which heat transmitted to the heat radiating portion is forcedly cooled, comprises a pump that circulates the liquid between the heat generating portion and the heat radiating portion, and a fan that forcedly discharges heat of the heat radiating portion to an outside, a temperature sensor that detects temperature of the heat generating portion, and storage information that beforehand prescribes the relationship between temperature of the heat generating portion and voltages of the pump and the fan, and a control device determines and controls voltages of the pump and the fan on the basis of temperature detected by the temperature sensor and the storage information.

Also, in the electronic equipment provided with the cooling system, the pump and the fan are operated at predetermined voltages when a load on the electronic equipment is small, a cooling capacity is increased by raising a pump voltage without changing a fan voltage when temperature detected by the temperature sensor exceeds a first temperature, and the cooling capacity is further increased by raising a fan voltage when temperature detected by the temperature sensor exceeds a second temperature higher than the first temperature.

Also, in the electronic equipment provided with the cooling system, the second temperature is a critical temperature achieved by the cooling capacity with only the pump.

By adopting such construction, it is possible according to the invention to efficiently use a liquid-cooling system to suppress an increase in noise produced by the fan.

According to the invention, noise can be restricted to a minimum in an electronic equipment, in which cooling is difficult with only a liquid-cooling system and there is a need of also using a fan in combination.

Further, since control takes account of a change in viscosity of a liquid that circulates in the system, it is possible to make efficient use of the liquid-cooling system at a high level. Also, excessive operations of both the fan and the pump can be suppressed, and there can be produced an effect that parts thereof are lengthened in life.

Other objects, features, and advantages of the invention will become apparent from the following description of an embodiment of the invention with reference to the accompanying drawings.

DESCRIPTION OF THE PREFERRED EMBODIMENT

An electronic equipment provided with a cooling system according to an embodiment of the invention will be described below in detail with reference to FIGS. 1 to 8. The embodiment will be described taking as an example the case where a cooling system is applied to a desktop type personal computer (referred below to as desktop PC).

Figure 1:
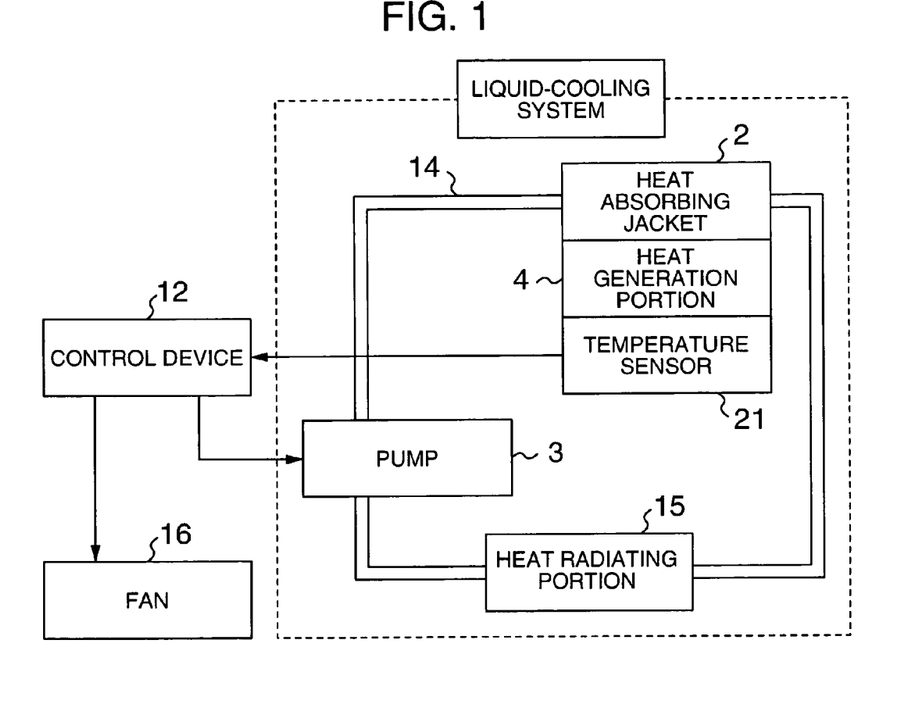
FIG. 1 is a block diagram showing a construction of a cooling system, according to an embodiment of the invention, provided with a liquid-cooling system and a fan air-cooling system.
Figure 2:
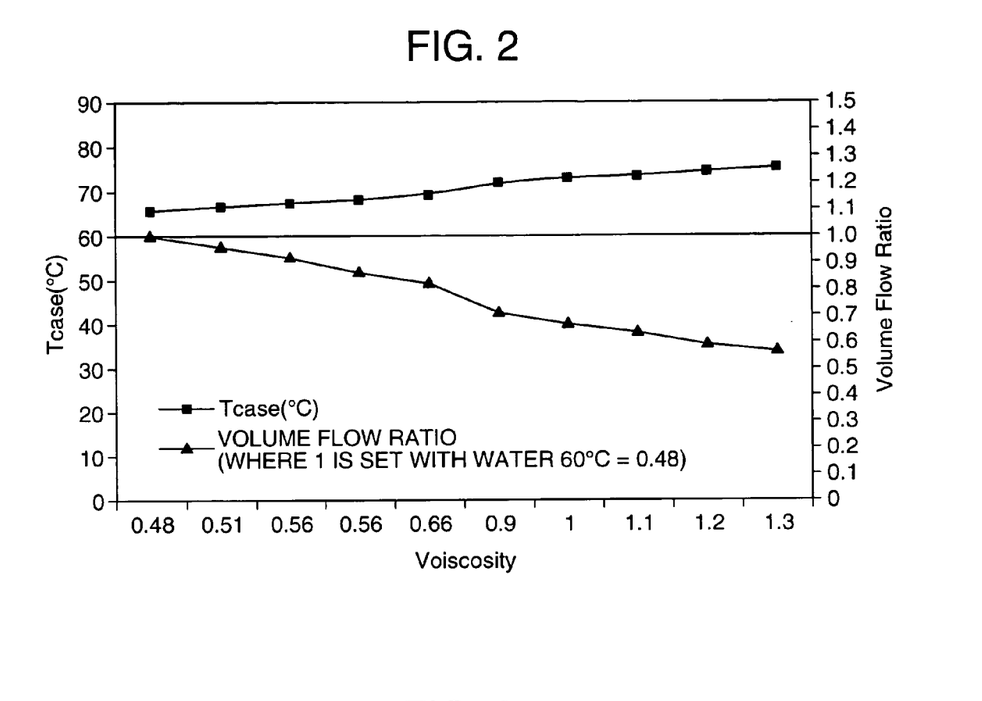
FIG. 2 is a graph showing a viscosity characteristic of a circulating liquid used in the cooling system according to the embodiment of the invention.
Figure 3:
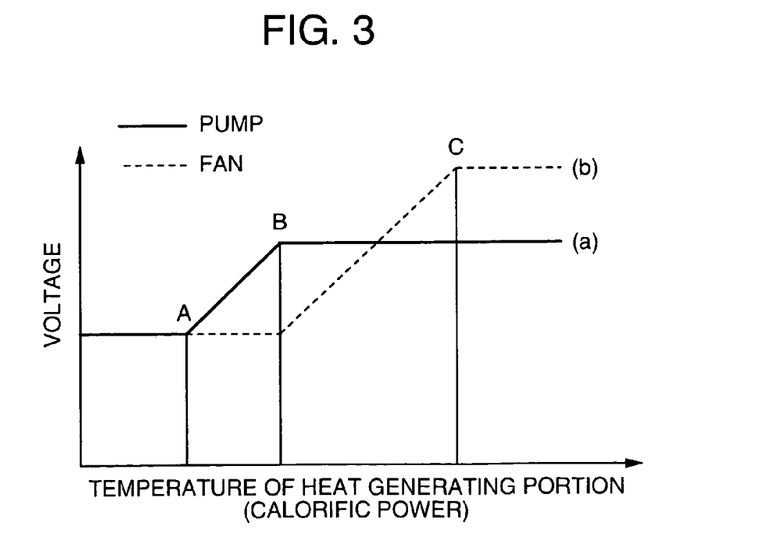
FIG. 3 is a graph showing the relationship between temperature of a heat generating portion and voltages of a pump and a fan, the relationship being stored in a control device in the embodiment of the invention.
Figure 4:
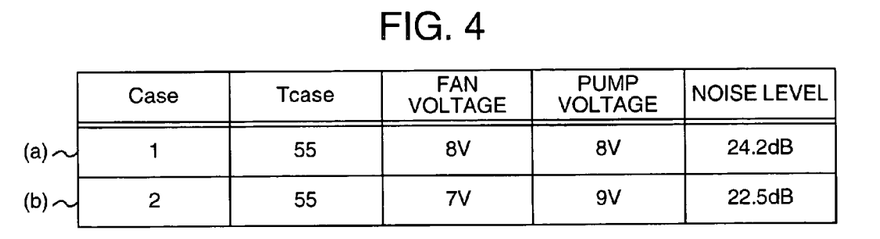
FIG. 4 is a view showing examples of control values of a fan voltage and a pump voltage at a certain temperature of the heat generating portion in the embodiment.
Figure 5:
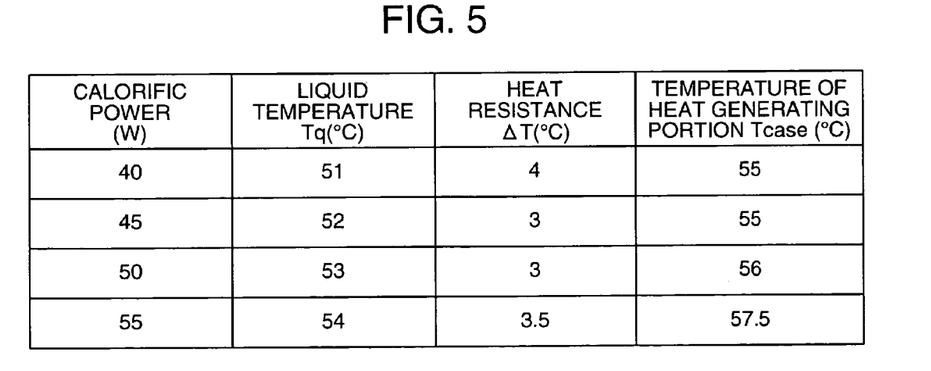
FIG. 5 is a view showing the relationship among calorific power, temperature $T_{case}$ of the heat generating portion, liquid temperature $T_q$, and temperature rise $\Delta T$ due to heat resistance in the embodiment.
Figure 6:
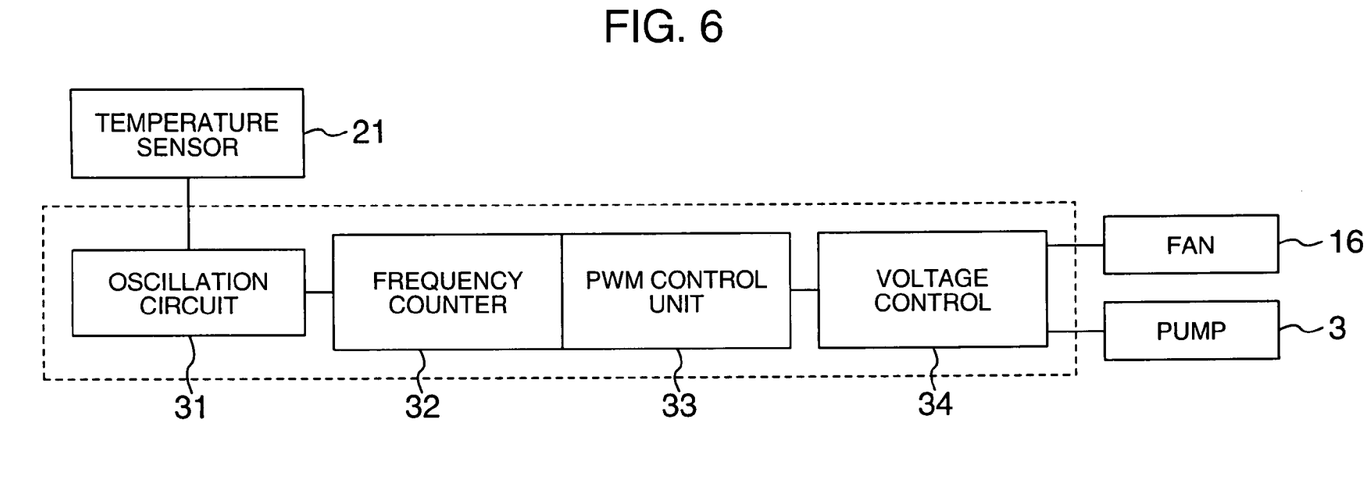
FIG. 6 is a block diagram showing a construction of the control device in the embodiment of the invention.
Figure 7:
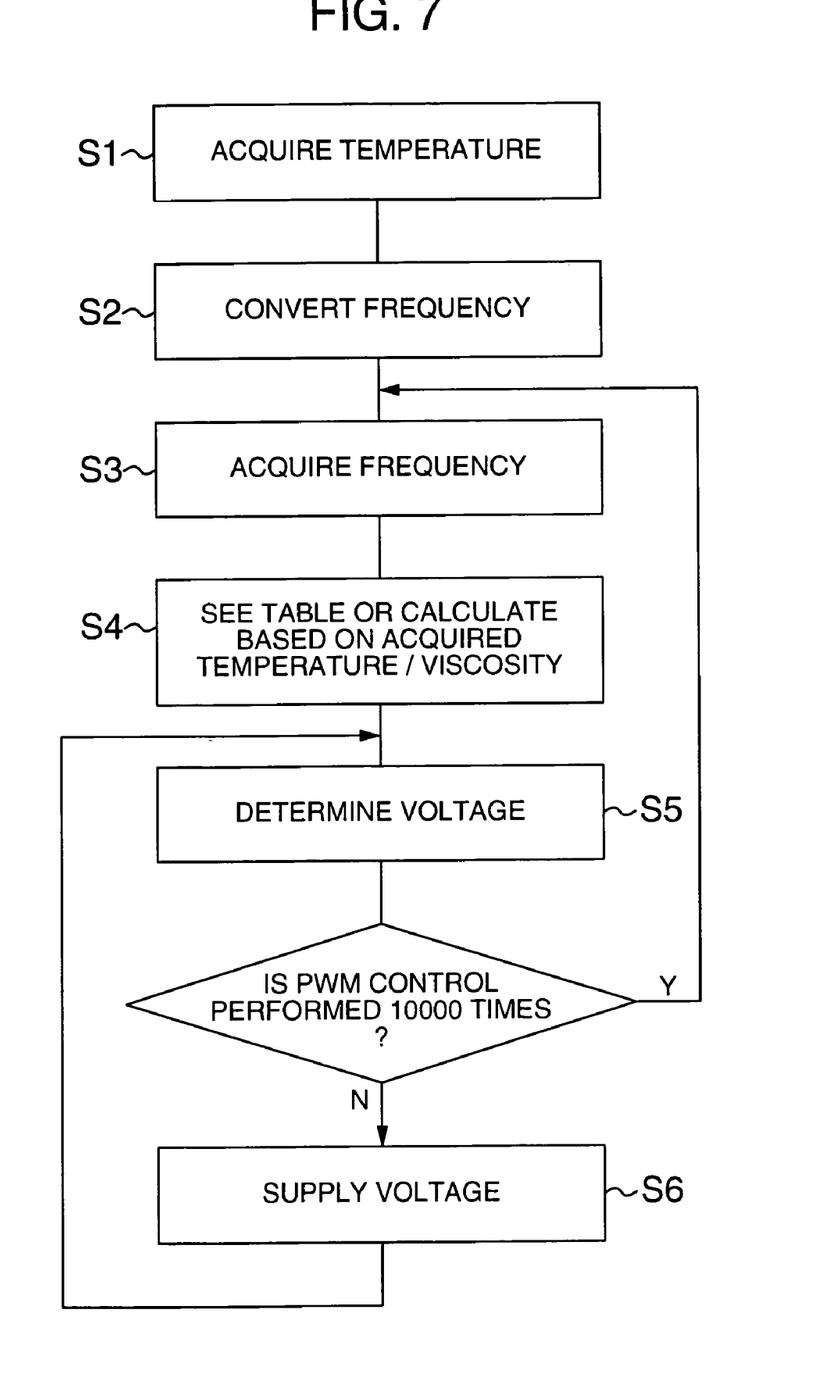
FIG. 7 is a flowchart illustrating the procedure of control in the control device in the embodiment of the invention.
Figure 8:
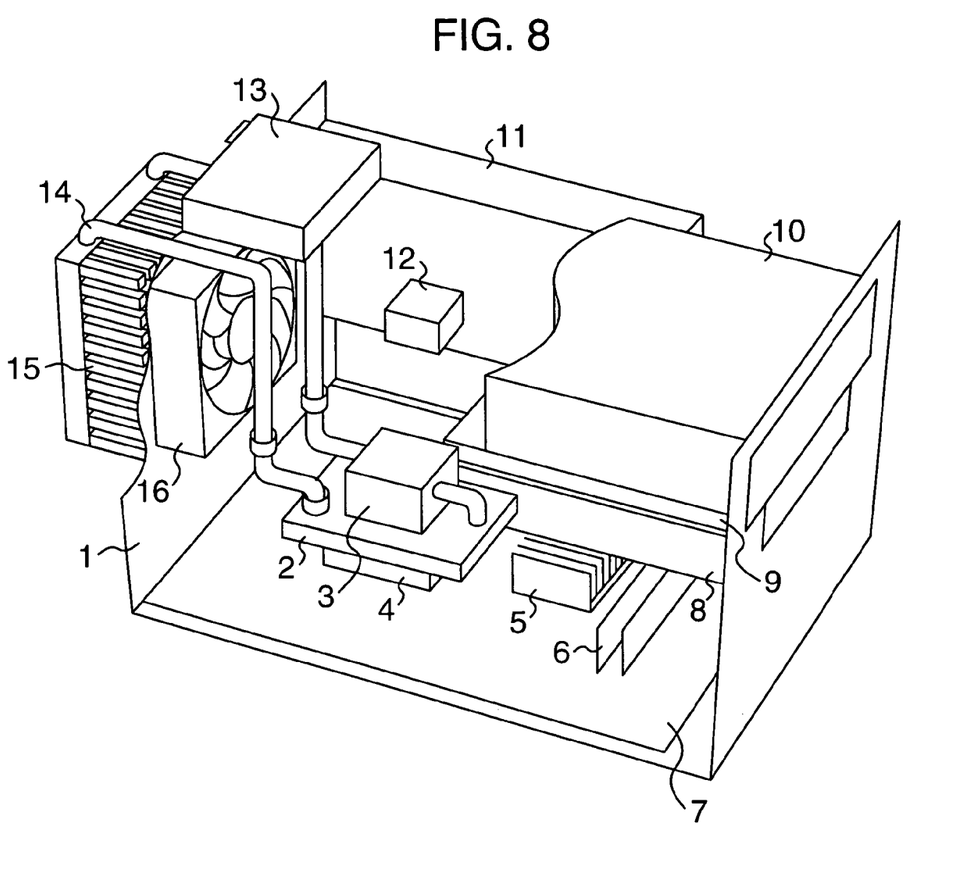
FIG. 8 is a perspective view showing the case where the cooling system according to the embodiment of the invention is applied to a desktop PC.

Here, FIG. 1 is a block diagram showing a construction of a cooling system, according to the embodiment of the invention, provided with a liquid-cooling system and a fan air-cooling system. FIG. 2 is a graph showing a viscosity characteristic of a circulating liquid used in the cooling system according to the embodiment of the invention. FIG. 3 is a graph showing the relationship between temperature of a heat generating portion and voltages of a pump and a fan, the relationship being stored in a control device in the embodiment of the invention. FIG. 4 is a view showing examples of control values of a fan voltage and a pump voltage at a certain temperature of the heat generating portion in the embodiment. FIG. 5 is a view showing the relationship among calorific power, temperature $T_{case}$ of the heat generating portion, liquid temperature $T_q$, and temperature rise $\Delta T$ due to heat resistance. FIG. 6 is a block diagram showing a construction of the control device in the embodiment of the invention. FIG. 7 is a flowchart illustrating the procedure of control in the control device in the embodiment. FIG. 8 is a perspective view showing the case where the cooling system according to the embodiment of the invention is applied to a desktop PC.

First, the outline of the cooling system according to the embodiment of the invention will be described by illustrating a desktop type personal computer (PC), to which the cooling system is applied. In FIG. 8, a mother board 7 assembled into a housing 1 mounts thereon a CPU 4, a set 5 of chips, and a memory 6. The CPU 4 has a maximum calorific power of 75 W and a specification temperature of 75° C. Also, a HDD 8, a FDD 9, and a CD-ROM 10 are mounted as external storage devices. Also, although not shown, the CPU 4 that constitutes a heat generating portion mounts thereto a temperature sensor 21 (see FIG. 1) and transmits temperature information to a control device 12 at constant intervals or continually.

A heat absorbing jacket 2 formed with a liquid flow passage contacts thermally with the CPU 4, and heat generated in the heat generating portion is absorbed through the heat absorbing jacket 2 by a liquid. The liquid is pressurized by the pump 3, circulates through a pipe 14 to radiate heat in a heat sink 15 that constitutes a heat radiating portion, and returns again to the pump 3 via a reserve tank 13. The reference numeral 11 denotes an electric power source, and 16 a fan that supplies wind to the heat sink 15.

An antifreezing solution for prevention of freezing is used for the liquid. The antifreezing solution has the viscosity about two times that of water, and a difference in viscosity according to temperature is such that the viscosity at 20° C. is about three times that at 60° C. FIG. 2 illustrates a difference in cooling capacity according to a difference in viscosity of the antifreezing solution used in the embodiment and an influence of the difference on the system. In FIG. 2, the axis of abscissa indicates the viscosity of a liquid (water) that contains the antifreezing solution, and the axis of ordinate indicates temperature $T_{case}$ of the heat generating portion and a volume flow ratio (when water is at 60° C. and has the viscosity of 0.48, the volume flow ratio assumes a reference value 1). The figure indicates that the higher the liquid viscosity, the smaller the volume flow ratio and the higher the temperature of the heat generating portion. This corresponds to a state, in which the operation is performed at a maximum calorific power (here, 80 W) and both the fan and the pump operate at constant voltages. As the viscosity increases, pressure loss in a circulating path increases to lead to reduction in flow ratio, and the heat absorbing jacket and the heat generating portion are increased in heat resistance, which makes adequate cooling impossible.

Subsequently, the outline of the principle of the cooling system according to the embodiment of the invention will be first described with reference to FIGS. 1 and 3. In the invention, a temperature sensor 21 is provided to acquire temperature of the main heat generating portion 4 (for example, the CPU in the computer), and temperature acquired by the temperature sensor 21 is transmitted to the control device 12. The control device 12 receives temperature information that is transmitted from the temperature sensor 21, at constant intervals or continually, and determines voltages of the pump 3 and the fan 16, as shown in FIG. 3, on the basis of the received temperature and information as beforehand stored. In this manner, according to the embodiment, points of voltage variation of the fan 16 and the pump 3 that have been beforehand confirmed by means of experiments or the like are stored as a table in the control device 12, and voltages of the fan and the pump are determined with reference to the temperature information as obtained and the table.

In the liquid-cooling system, temperature $T_{case}$ of the heat generating portion is represented by the sum ($T_{case}=T_q+\Delta T$) of liquid temperature $T_q$ and temperature rise $\Delta T$ (corresponding to heat accumulated between the heat absorbing jacket and the liquid) due to heat resistance between the liquid—the heat absorbing jacket. Here, since the temperature rise due to heat resistance between the heat absorbing jacket—the liquid assumes a predetermined value according to the heat absorbing jacket, it is included in $\Delta T$. The liquid temperature $T_q$ can be mainly decreased as the heat radiating plate is increased in capacity, that is, the fan is raised in voltage. Also, $\Delta T$ can be decreased by reducing heat resistance of the heat absorbing jacket. In other words, $\Delta T$ can be decreased by increasing the heat absorbing jacket—the circulating liquid in heat transfer coefficient.

In order to increase the heat transfer coefficient between the heat absorbing jacket—the liquid, it suffices to increase the fluid volume flow. The volume flow of the circulating liquid is mainly dependent upon the capacity of the pump but is also governed by the viscosity of the circulating liquid and pressure loss in the flow passage. Generally, the higher the temperature, the lower the viscosity of the liquid, and a decrease in volume flow is also restricted. Also, an antifreezing solution having a higher viscosity and a higher temperature dependency than those of water is usually used for the liquid-cooling system for the purpose of prevention of freezing.

Therefore, in order to decrease $\Delta T$, it suffices that the pump voltage be raised to increase the volume flow of the liquid and cooling effected by the fan be restricted so as to suppress reduced temperature of the circulating liquid (that is, so as to avoid reduction in liquid temperature that leads to an increase in viscosity). Since $T_q$ and $\Delta T$ are in a reciprocal relationship, it suffices that $T_q$ be lowered ($\Delta T$ increases), or $\Delta T$ be decreased ($T_q$ increases) in order to maintain $T_{case}$ constant.

When the above explanation is expressed by way of concrete illustration, the case where $T_q$ is 50° C. and $\Delta T$ is 5° C. and the case where $T_q$ is 52° C. and $\Delta T$ is 3° C. are exemplarily given with reference to FIG. 5 in order to maintain $T_{case}$ at a constant value of 55° C. where the temperature $T_q$ depends upon an operating state of the fan and $\Delta T$ depends upon the magnitude of the liquid volume flow that is determined by the pump voltage. And, since noise produced by the device is greatly attributable to the fan, temperature rise of $T_{case}$ accompanying an increase in calorific power is suppressed not by lowering $T_q$ but by decreasing $\Delta T$.

In other words, according to the invention, with an increase in calorific power (=temperature rise of the heat generating portion), the cooling capacity is enhanced by first keeping the fan at a constant voltage and raising the pump voltage (lowering the heat resistance of the liquid—the heat absorbing jacket), and then raising the fan voltage (see FIG. 3) at a point of time when the cooling capacity is not enhanced even by raising the pump voltage (at a point of time when reduction of $\Delta T$ due to lowering of heat resistance is small as compared with temperature rise of $T_q$). In addition, when the calorific power is maximum, the fan and the pump are fully operated.

Thereby, an increase in noise can be restricted to a minimum while restricting temperature drop, that is, viscosity rise of the liquid that circulates in the system, and making full use of the cooling capacity of the liquid-cooling system.

In order to realize the technical thought of the invention described above, according to the embodiment of the invention, the control device is used to control the fan voltage and the pump voltage on the basis of temperature of the heat generating portion and a data table (a graph shown in FIG. 3), in which an optimum fan voltage and an optimum pump voltage have been beforehand confirmed by means of experiments, etc. Also, in the case where a state, in which the control device cannot receive temperature information from the sensor, is brought about when a trouble occurs, both the fan and the pump are fully operated to perform cooling for the sake of safety (the control mode at a point C shown in FIG. 3).

Subsequently, the cooling system according to the embodiment of the invention will be described by way of a concrete example with reference to FIG. 3. Both the pump 3 and the fan 16 mounted on a desktop PC that constitutes a configurational example in the embodiment can operate in the voltage range of 7 V to 12 V. In a state, in which the heat generating portion is low in calorific power, that is, a load on the device is small, both the pump 3 and the fan 16 operate at 7 V.

The control device 12 determines voltages of the pump 3 and the fan 16 on the basis of temperature information transmitted from the temperature sensor 21 and the information shown in FIG. 3. When a load is small as in a state, in which the device (desktop PC) idles, or the like, both the pump 3 and the fan 16 are caused to operate at 7 V (the point A in FIG. 3). As the device is loaded and temperature rises accompanying an increase in calorific power, cooling is performed by first raising the pump voltage. At this time, the heat generating portion is at temperature of 5° C. Since the fan voltage is constant at this time, liquid temperature of the system is rising. Also, with an increase in calorific power, $\Delta T$ in the heat absorbing jacket increases but heat resistance reduced and $\Delta T$ is gently rising since the pump is increased in volume flow.

At a point of time when the pump voltage becomes 9 V, the limit of cooling is reached due to an increase in pump voltage and the fan 16 is raised in voltage (the point B in FIG. 3) in order to enhance the heat radiating force of the heat radiating plate. At this time, the heat generating portion is at temperature of 5° C. Also, at the point C, that is, when a load on the device is maximum, the fan and the pump, respectively, operate at 12 V and 9 V to lower temperature of the heat generating portion to the specification temperature or lower.

FIG. 4 shows examples of voltages of the pump and the fan at the time of $T_{case}$=55° C. in the embodiment. Temperature $T_{case}$ of the heat generating portion can be calculated by the sum ($T_{case}$=$T_q$+$\Delta T$) of liquid temperature $T_q$ and heat resistance $\Delta T$ between the heat absorbing jacket—the liquid. Therefore, in the case where $T_{case}$ is to be kept at 5° C., there are supposed, as shown in FIG. 3, the case where both the pump and the fan operate at 8 V ((a) in FIG. 4) and the pump and the fan, respectively, operate at 7 V and 9 V ((b) in FIG. 4).

At the time of (a) in FIG. 4, $T_q$ and $\Delta T$, respectively, are 49° C. and 6° C. At the time of (b) in FIG. 4, $T_q$ and $\Delta T$, respectively, are 51° C. and 4° C. At the time of (a) in FIG. 4, as compared with the case at the time of (b) in FIG. 4, since the pump voltage is low, there is caused reduction in volume flow, and besides, since the fan voltage is high, liquid temperature lowers, the circulating liquid is increased in viscosity, and thereby there is caused further reduction in volume flow. At the time of (b) in FIG. 4, the ratio of $T_{case}$ is high due to liquid temperature but the liquid is correspondingly decreased in viscosity, so that $\Delta T$ is suppressed to a low level due to an increase in volume flow. Noise level assumes 24.2 dB and 22.5 dB, respectively, at the time of (a) and (b) in FIG. 4, and thus noise level is suppressed to be low by 1.7 dB in control at the time of (b) in FIG. 4 even in the case where $T_{case}$ is to be kept at the same temperature.

Therefore, according to the embodiment, control is performed so as not to raise the fan voltage until $T_{case}$ exceeds 5° C. In the case where $T_{case}$ has exceeded 55° C., cooling becomes difficult only with a rise in pump voltage, that is, in the case where the liquid temperature rises with an increase in calorific power as shown in FIG. 5, the fan voltage is not caused to rise until a stage, at which the heat resistance reducing effect is lowered due to liquid temperature rise, is brought about.

Next, FIG. 6 is a block diagram of the control device 12. Temperature (S1 in FIG. 7) acquired by the temperature sensor 21 is converted into an oscillating frequency by an oscillation circuit 31 (S2 in FIG. 7). The oscillation circuit 31 can oscillate a frequency of 1 kHz to 50 kHz for a temperature range of 20° C. to 10° C. A frequency counter 32 examines the frequency (S3 in FIG. 7), according to which a PWM control unit 33 oscillates a PWM signal (S4 in FIG. 7). Receiving the signal, a voltage control device 34 operates the fan 15 and the pump 3 (S5 in FIG. 7). Here, an explanation will be exemplarily given with respect to the case where the frequency counter 32 and the PWM control unit 33 are controlled by software that is created by an assembly, etc.

A program of the frequency counter measures the number of times of rise from Low to High in the signal transmitted from the oscillation circuit 31 during 1 msec. Here, turn-around time, in which rise from Low to High is checked once, is set to 11 □sec, this checking is repeated 91 times, and the total number of times of rise in 1 msec is counted. Therefore, the sampling frequency is 100 kHz, counting up to a waveform of 50 kHz can be made by the sampling theorem, and measurement up to about 100° C. can be made in the oscillation circuit 31.

The PWM control unit 33 receives a frequency measured by the frequency counter 32, and voltages are determined on the basis of the information to operate the fan 16 and the pump 3. Since the fan 16 and the pump 3 is supplied with electric power while the PWM control is performed, the PWM control stops during the processing of the frequency counter, that is, supplying of electric power to the fan 16 and the pump 3 is stopped, but such stoppage is momentary in ¹⁄₁₀₀₀ sec, so that operation of the fan 16 and the pump 3 will not stop completely. Since the PWM control requires a high-speed processing from the viewpoint of its characteristics, the processing time per once is set to 0.5 msec. Time between change of temperature of the heat generating portion and determination of voltages for the changed temperature is set to 5 sec.

In addition, since temperature of the heat generating portion is lowered with a liquid as a medium, it is impossible that the temperature rapidly rises to a dangerous level within 5 sec. This is because of a large thermal capacity of a liquid. Therefore, a value present in the frequency counter 32 is acquired in the ratio of 10000 times of the PWM control to once, and control correspondingly determines supply voltages.

While the embodiment has been described with respect to the case where one representative heat generating portion is made a target for cooling, temperature information of the portion is acquired in order to cool the heat generating portion, and operating voltages of the pump and the fan are determined on the basis of the temperature in view of a difference in cooling capacity due to a difference in viscosity of the liquid, such example is not limitative but the temperature information, the pump, and the fan may be plural. For example, in an electronic equipment typified by high-end servers and provided with a plurality of CPUS, voltages may be determined by acquiring temperature information of the respective CPUs, and in some cooling constructions temperature information including other heat generating portions, for example, HDD, electric power source, etc. may be acquired and voltage control may be correspondingly performed.

As described above, the embodiment of the invention has a feature in that in a state, in which a load on an electronic equipment is small, a pump for pressurizing a liquid being a heat transfer medium in a liquid-cooling system and a fan are caused to operate at low speeds, as a load on the electronic equipment increases, only the pump voltage is raised on the basis of temperature information from the temperature sensor 21 mounted on the heat generating portion 4 and temperature information (the table shown in FIG. 3) taking beforehand account of a change in cooling capacity due to the viscosity of the circulating liquid in the system, and the fan voltage is raised in a stage, in which the cooling capacity of the heat generating portion reaches a limit.

By making the operation timing of the fan after that of the pump, an increase in noise that is caused by the operation of the fan is reduced, and by restricting an increase in the viscosity of the liquid, the cooling capacity itself of the liquid-cooling system is enhanced. Also, by suppressing unnecessary operations, there is produced an effect that the fan is lengthened in life.

While the embodiment has been described, the invention is not limited thereto but it is apparent to those skilled in the art that various modifications and corrections are possible within the spirit of the invention and the scope of the appended claims.

What is claimed is:

1. A cooling system for an electronic equipment having a heat generating portion, said cooling system comprising:

a heat radiating portion;

a pump that circulates a liquid cooling medium between the heat generating portion and the heat radiating portion, said liquid cooling medium having a viscosity that decreases as a temperature thereof increases;

a fan that discharges heat of the heat radiating portion to an outside, a temperature sensor that detects temperature of the heat generating portion, means for storing predetermined storage information that prescribes a relationship between temperature of the heat generating portion and driving voltages of the pump and the fan, and a control device configured to determine and control voltages of the pump and the fan on the basis of temperature detected by the temperature sensor and the storage information, wherein said storage information regulates the driving voltages of the pump and the fan so as to make the driving voltage of the pump high and increase a cooling capacity when the temperature of the heat generating portion increases, and further to make the driving voltage of the fan high and increase a cooling capacity when the temperature of the heat generating portion increases to increase an amount of heat generation, and wherein said control device is configured to operate said pump and fan at a predetermined non-zero voltage when the temperature detected by said temperature sensor does not exceed a first temperature, and further said control device, using said storage information, is configured to maintain the driving voltage of the fan unchanged and to continuously increase the driving voltage of the pump to increase a flow rate of said liquid cooling medium and to increase a cooling capacity of the cooling system when the temperature detected by said temperature sensor increases between said first temperature and a second temperature higher than said first temperature, and to increase the driving voltage of the fan to further increase a flow rate of the fan and to further increase the cooling capacity of the cooling system when the temperature detected by the temperature sensor exceeds said second temperature higher than said first temperature.

2. A cooling system for an electronic equipment according to claim 1, wherein the second temperature is a critical temperature achieved by the cooling capacity with only the pump.

3. A cooling system for an electronic equipment according to claim 1, wherein when temperature of the heat generating portion cannot be detected by the temperature sensor, control is performed by determining voltages identical to voltages of the pump and the fan when temperature of the heat generating portion is highest.

* * * * *